(12) United States Patent
McBride (10) Patent No.: US 6,367,055 B1
(45) Date of Patent: Apr. 2, 2002

(54) METHOD AND APPARATUS FOR DETERMINING CERTAIN CHARACTERISTICS OF CIRCUIT ELEMENTS

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/299,996

(22) Filed: Apr. 27, 1999

(51) Int. Cl.$^7$ ............................................... G06F 17/50
(52) U.S. Cl. .................... 716/4; 716/2; 716/6; 716/121
(58) Field of Search ....................................... 716/12, 4

(56) References Cited

U.S. PATENT DOCUMENTS

| | | | | |
|---|---|---|---|---|
| 5,384,710 A | * | 1/1995 | Lam et al. | |
| 5,610,832 A | * | 3/1997 | Wikle | |
| 5,666,289 A | * | 9/1997 | Watkins | |
| 5,692,160 A | * | 11/1997 | Sarin | |
| 5,787,006 A | * | 7/1998 | Chevallier et al. | |
| 5,987,237 A | * | 11/1999 | McBride | |
| 6,014,508 A | * | 1/2000 | Christian et l. | |
| 6,077,717 A | * | 6/2000 | McBride | 438/10 |
| 6,117,179 A | * | 9/2000 | Tan et al. | 703/14 |
| 6,131,182 A | * | 10/2000 | Beakes et al. | 716/8 |

OTHER PUBLICATIONS

G. Pelz, An Interpreter for General Netlist Design Rule Checking, Proceedings of ACM/IEEE Design Automation Conference, Jun. 1992, pp. 305–310.*

* cited by examiner

Primary Examiner—Matthew Smith
Assistant Examiner—A. M. Thompson (57) ABSTRACT

The present invention is generally directed to a system and method for efficiently evaluating a design quality of a circuit defined by a netlist. An inventive method includes the steps of creating an element data structure for each circuit element in the netlist, wherein the data structure of a given element defines a plurality of physical characteristics for the element, and creating a node data structure for each circuit node in the netlist, wherein the data structure of a given node defines a plurality of physical characteristics for the node. Thereafter, the method determines a TRUE/FALSE value for the physical characteristics for entries within both the element data structure and the node data structure. Finally, the method records the determined TRUE/FALSE values for later retrieval. An inventive system includes an element data structure for defining each circuit element in the netlist, wherein the data structure of a given element defines a plurality of characteristics for the element. The system further includes means for generating TRUE/FALSE value for the characteristics for entries within the element data structure, and means for recording the determined TRUE/FALSE values for later retrieval. During operation, as the system needs the values of various physical characteristics in order to evaluate the design quality of the circuit, the system may simply retrieves the stored values, for each of the relevant physical characteristics. Otherwise, the system computes these values as needed.

18 Claims, 8 Drawing Sheets

```
ELEMENT { ~~~~
          ~~~~~~
          Probable Complementary Pass FET
          Complementary Pass FET
          RAM Pass FET
          Single Pass FET
          MOS Capacitor
          Always ON Pass FET
          Channel to Port
          Gate to Port
          Resistor
          ~~~~~~
          ~~~~~~
          Direction: Unset, Bidirectional, Source-to-Drain,
                     Drain-to-Source
          ~~~~~~ }
```

```
NODE {  ~~~~
        ~~~~
        Precharge Node
        Precharge Input
        Latch Node
        Static Gate Output
        Block Input
        Block Output
        Block Bidirectional
        Clock
        Pass Gate Output
        Mux Output
        Pass Gate Input
        Drives FET Gate
        RAM Node
        Buffered Precharge Node
        Low Supply (Ground)
        High Supply (Vdd)
        ~~~~~
        ~~~~~
        ~~~~~~ }
```

ELEMENT {  ~~~~
            ~~~~
            Probable Complementary Pass FET
            Complementary Pass FET
            RAM Pass FET
            Single Pass FET
            MOS Capacitor
            Always ON Pass FET
            Channel to Port
            Gate to Port
            Resistor
            ~~~~~
            ~~~~~
            Direction: Unset, Bidirectional, Source-to-Drain,
                      Drain-to-Source
            ~~~~~}

FIG. 4A

NODE { ~~~~

~~~~

Precharge Node
Precharge Input
Latch Node
Static Gate Output
Block Input
Block Output
Block Bidirectional
Clock
Pass Gate Output
Mux Output
Pass Gate Input
Drives FET Gate
RAM Node
Buffered Precharge Node
Low Supply (Ground)
High Supply (Vdd)
~~~~~
~~~~~
~~~~~}

METHOD AND APPARATUS FOR DETERMINING CERTAIN CHARACTERISTICS OF CIRCUIT ELEMENTS

TECHNICAL FIELD OF THE INVENTION

The present invention generally relates to computer-aided circuit design systems and, more particularly, to a method and apparatus for efficiently evaluating a netlist to determine certain characteristics of circuit elements.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells include full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. In this regard, "design quality" refers to any of a number of tests or checks that may be performed on a circuit. For example, identifying nodes that may be subject to charge sharing, or identifying an excessive number of series-connected pass gates, are examples of circuit checks that may be desired. The present invention may work in conjunction with a tool like PathMill, for example, to build a database which is then utilized by the rules checking system of the present invention to evaluate the design quality of a circuit. Typically, such tools, including PathMill, operate on a netlist to determine FET (field effect transistor) direction, node types, latches, dynamic gates, rise and fall times, etc. This information is utilized by the present invention to build a database which is then utilized by the rules checking system of the present invention to evaluate the design quality of network nodes, preferably of network nodes of FET-level circuits designed in accordance with VLSI techniques.

It should be appreciated that, when evaluating a relatively large netlist for a relatively large number of circuit characteristics, the process may be extremely time consuming and computationally intensive. Accordingly, it is desired to structure and conduct the evaluation in a manner that is highly efficient.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for efficiently evaluating a design quality of a circuit defined by a netlist. In accordance with one aspect of the invention a method is provided for examining a netlist to evaluate a design quality of a circuit. The method includes the steps of creating an element data structure for each circuit element in the netlist, wherein the data structure of a given element defines a plurality of physical characteristics for the element, and creating a node data structure for each circuit node in the netlist, wherein the data structure of a given node defines a plurality of physical characteristics for the node. Thereafter, the method determines a TRUE/FALSE value for the physical characteristics for entries within both the element data structure and the node data structure. Finally, the method records the determined TRUE/FALSE values for later retrieval.

During operation, the method of the preferred embodiment evaluates the design quality of a circuit by determining a number of individual design aspects. The method, in turn, determines each design aspect by evaluating a number of individual physical characteristics of the circuit. For each of these physical characteristics, if the characteristic has been pre-computed and recorded, the method simply retrieves the recorded value for use in the larger evaluation. If, however, the characteristic has not been pre-computed and recorded, the method then computes the characteristic "on the fly."

The terms "design quality", "design aspect(s)", and "physical characteristics" have not been chosen for any specific meaning or connotations, but rather have been arbitrarily selected simply to facilitate the description of the invention as set forth herein, and these terms should not be viewed as limiting on the invention. Specifically, the term "design quality" is hereinafter used to denote the entire circuit design quality as determined by the electrical rules checker of the present invention. In this regard, the overall design quality is reflected, collectively, by a plurality of design aspects. Each design aspect is, in turn, reflected, collectively, by a plurality of physical characteristics. For example, one design aspect may be whether certain nodes within a circuit are susceptible to a charge sharing phenomenon. Various factors (physical characteristics) may, collectively, be necessary in order to make that determination. For example, a given node may need to be evaluated to determine whether it is an output node.

In accordance with another aspect of the present invention, a method is provided for examining a netlist to evaluate a design quality of a circuit by first identifying a plurality of quality aspects to be evaluated, wherein each quality aspect is defined by at least one physical characteristic. Thereafter, the method selects a group of physical characteristics, from the plurality of physical characteristics to be determined in evaluating the design quality of the circuit. The method determines a TRUE/FALSE value for each physical characteristic of the group of characteristics, and records the determined values for later retrieval. Thereafter, the method evaluates the plurality of quality aspects, using the recorded values of characteristics where appropriate.

In accordance with yet another aspect of the present invention, a system is provided for examining a netlist to evaluate a design quality of a circuit. This system includes an element data structure for defining each circuit element in the netlist, wherein the data structure of a given element defines a plurality of characteristics for the element. The system further includes means for generating TRUE/FALSE value for the characteristics for entries within the element data structure, and means for recording the determined TRUE/FALSE values for later retrieval. During operation, as the system needs the values of various physical characteristics in order to evaluate the design quality of the circuit, the system may simply retrieves the stored values, for each of the relevant physical characteristics. Otherwise, the system computes these values as needed.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PRESENT INVENTION

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 1:
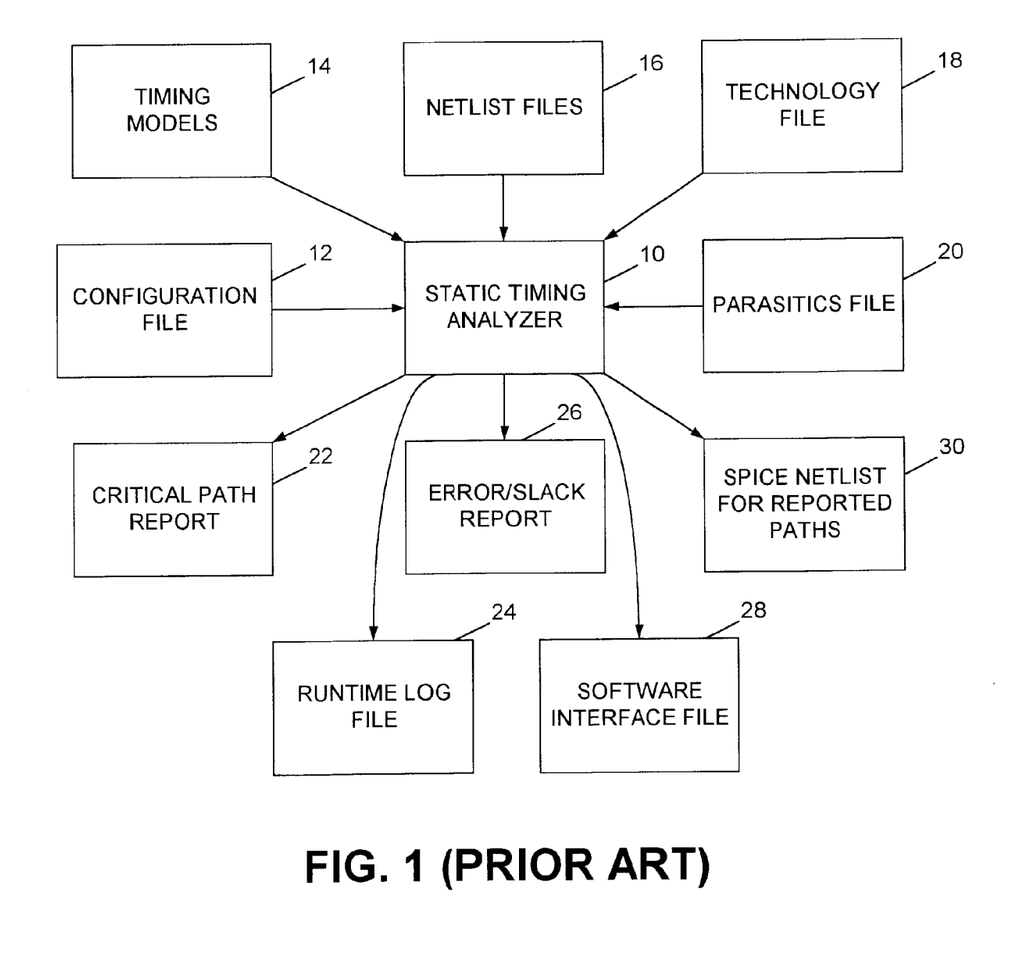
FIG. 1 is a block diagram of a static timing analyzer system, as is known in the prior art.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
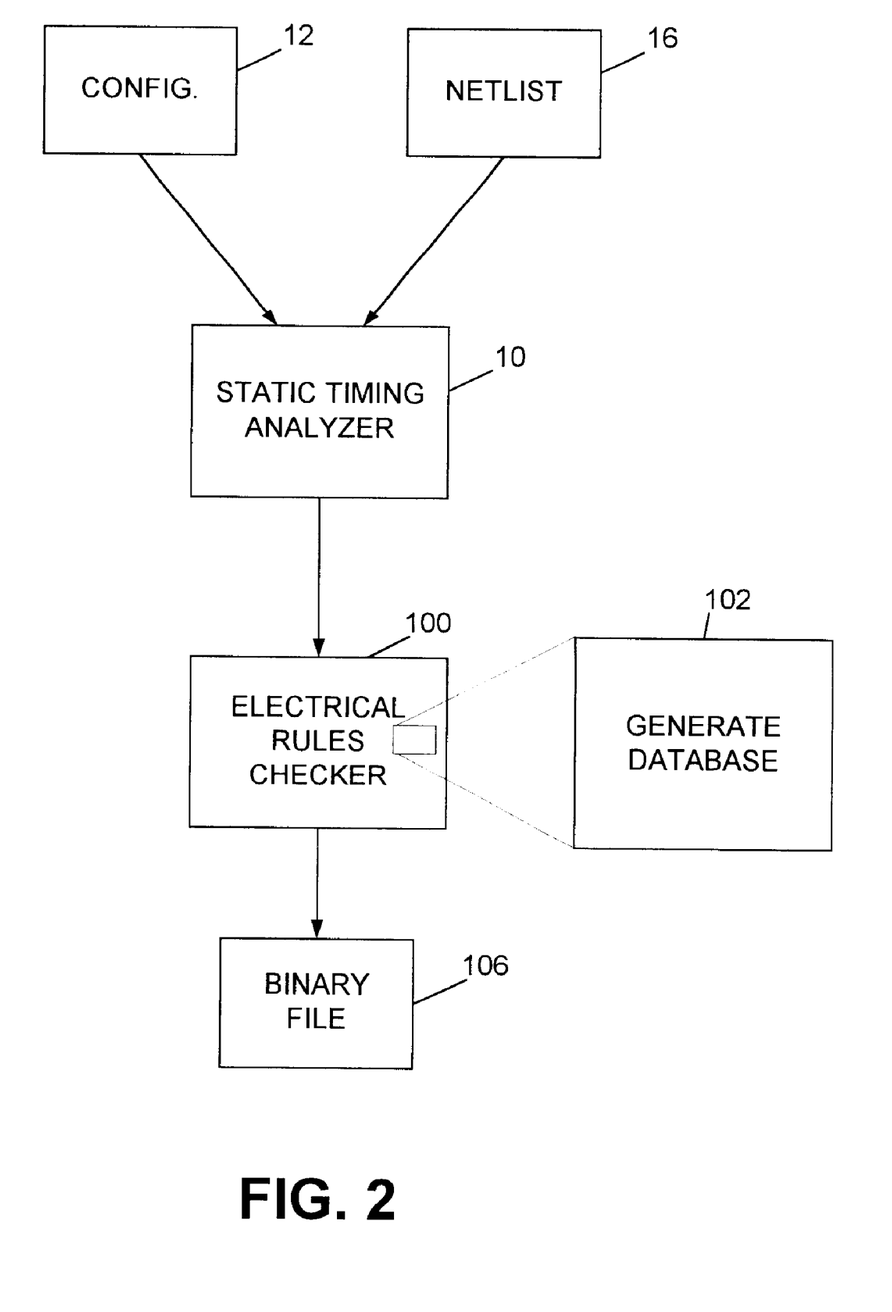
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 in accordance with the preferred embodiment of the present invention operates to identify whether certain nodes may be subject to a charge sharing effect. This is only one example of the multitude of checks which may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

In one respect, the electrical rules checker 100 may be viewed as a program that evaluates the design quality of a circuit. As previously mentioned, the term "design quality" is used to denote the entire circuit design quality as determined by the electrical rules checker of the present invention. In this regard, the overall design quality is reflected, collectively, by a plurality of design aspects. Each design aspect is, in turn, reflected, collectively, by a plurality of physical characteristics. For example, one design aspect may be whether certain nodes within a circuit are susceptible to a charge sharing phenomenon. Various factors (physical characteristics) may, collectively, be necessary in order to make that determination. For example, a given node may need to be evaluated to determine whether it an output node. This evaluation may require an examination of each element that is connected to the node to determine whether the node is defined to be an output node of that particular circuit element.

Thus, the electrical rules checker 100 comprises a large collection of routines that are used to determine various design aspects. These routines must often evaluate various physical characteristics of circuit nodes and/or circuit elements. Many of these physical characteristics are needed repeatedly. Furthermore, these physical characteristics are static values, and do not vary from evaluation to evaluation, for a given netlist. Accordingly, it has been found in constructing the electrical rules checker 100 of the present invention, that some of the routines are called numerous times for determining a variety of the physical characteristics that are quantified by the electrical rules checker 100 of the present invention. It has also been found that other routines are seldom utilized by the electrical rules checker 100 of the present invention.

Figure 3:
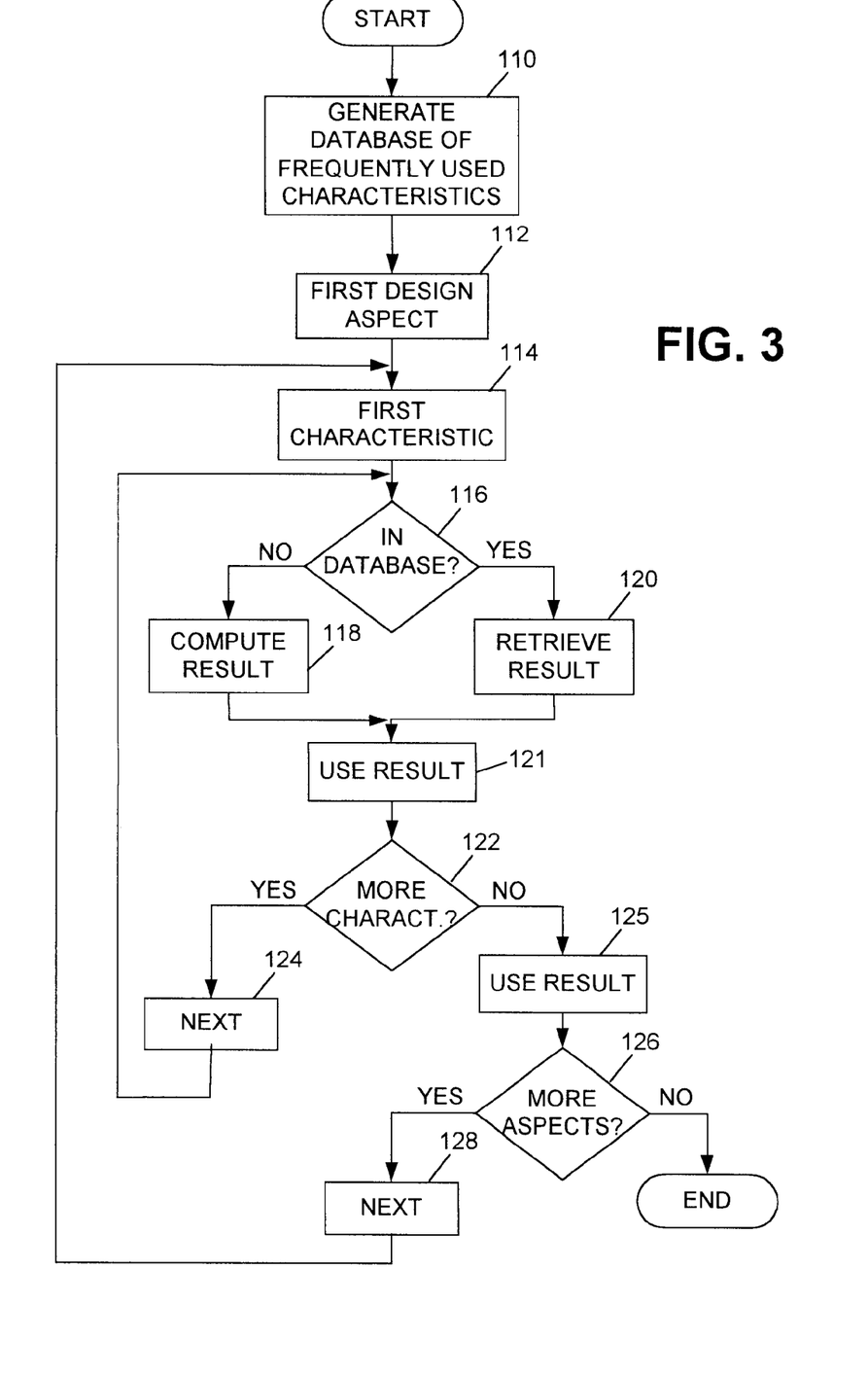
FIG. 3 is a flowchart illustrating the top level operation of an electrical rules checker constructed in accordance with the invention.

In this regard, and with reference to FIG. 3, it has been found that repeatedly performing the calculations and/or computations that are necessary to ascertain certain physical characteristics places a significant drain on system resources, particularly for those physical characteristics that are reference many times in performing the overall design quality evaluation of the electrical rules checker 100. Accordingly, the preferred embodiment of the present invention performs many of these routines at a front end of the electrical rules checker 100, and stores the results in a database (step 110).

On the other hand, many of the physical characteristics may be referenced only seldomly. In one operational embodiment of the present invention, the electrical rules checker 100 may be configured to evaluate a limited set of physical characteristics. As a result, other physical characteristics may not be computed/calculated at all. Accordingly, it would be inefficient to compute the routines associated with these physical characteristics as a part of the front-end processing of the electrical rule checker 100.

Therefore, and in accordance with the present invention, routines that are performed a relatively few times (in comparison to others) are not pre-computed as a part of the database generation of step 110. Instead, only certain, select routines are pre-computed to determine certain physical characteristics associated with the circuit of the netlist. Selectively executing certain routines and generating a database of various physical characteristics significantly enhances the overall performance and efficiency of the electrical rules checker 110, in accordance with the invention. As will be further illustrated in FIGS. 4A and 4B, the physical characteristics for a given circuit configuration are static values, and therefore may be pre-computed and stored largely as TRUE/FALSE values in a data structure for each element and each node for circuit defined by the netlist. The collection of values stored within these data structures may then comprise the database that is generated as part of the front-end operation of the electrical rules checker 100.

To help illustrate the relationship among design aspects and physical characteristics, consider the following segment of pseudo-code of a program to compute the design quality of a circuit:

Compute Design Aspect 1
if ((Physical Characteristic 1) and (Physical Characteristic 2)) then compute X=Y+2Z;
while (Physical Characteristic 3) then . . .
if ((Physical Characteristic 1) and (Physical Characteristic 4)) then generate error message; . . .
Compute Design Aspect 2 . . .
Compute Design Aspect n It will be appreciated from the foregoing example that a given circuit design quality may be determined by computing (or evaluating) a number of differing design aspects. In the computation of each design aspect, a number of physical characteristics may be evaluated. Those physical characteristics that are used most often in the program for computing an overall design quality are pre-computed, in accordance with the present invention, and stored for ready access in a database.

In keeping with the description of FIG. 3, after the electrical rules checker 100 has generated the database of frequently used physical characteristics for a given circuit, it then proceeds into its normal operation. In accordance with its normal execution, the electrical rules checker 100 obtains a first design aspect (step 112), which is desired to be tested for given circuit. As previously mentioned, this design aspect may be characterized by a plurality of physical characteristics, which are stored within the database in the form of the data structure. Accordingly, a first physical characteristic that is desired as a part of the design aspect is identified (step 114).

Thereafter, the electrical rules checker 100 determines whether the current physical characteristic is present within the database. Specifically, the electrical rules checker 100 determines whether the current physical characteristics has been precomputed as apart of the database generation (step 116). If so, the electrical rules checker 100 of the present invention may simply retrieve the pre-stored value from the appropriate data structure (step 120). As will be discussed in more detail in connection with FIGS. 4A and 4B, a separate data structure may be provided for each element within the netlist. A separate data structure may also be provided for each node within the netlist. If the particular physical characteristic was not pre-generated and stored as a part of the database, then the electrical rules checker 100 computes the value of this physical characteristic at this time (step 118). After the physical characteristic has either been retrieved or computed, the method may use the characteristic in whatever manner is appropriate under the current circumstances (step 121). The characteristic may simply be used as a part of evaluating a conditional expression, it may be used in calculating an equation, or it may be used in a variety of other ways, consistent with the invention.

The electrical rules checker 100 then evaluates whether there are more characteristics to be evaluated and associated with the current design aspect (step 122). If so, the electrical rules checker 100 obtains the next characteristic to be determined, returns to step 116, and proceeds as described above. If no additional characteristics are to be determined, then the current aspect has been determined. In accordance with one embodiment, the present invention may utilize an aspect as part of a computation or other more encompassing evaluation. Thus, if appropriate under the circumstances, the inventive method may use the aspect (step 125). Then, the electrical rules checker 100 determines whether there are any additional design aspects to be evaluated (step 126). If so the next design aspect is obtained (step 128), the electrical rules checker 100 returns to step 114, and continues processing from that point in the manner described above. If step 126 results to no, then the electrical rules checker 100 has completed all processing, and has performed all circuit design evaluation tests desired for that given execution of electrical rules checker 100.

It will be appreciated that step 110 (the generation of the database) will be performed only once in connection with a given circuit evaluation. However, the remaining steps may be repeatedly performed, depending upon the information desired. For example, the steps may be performed for each node in a circuit design, or alternatively for each element in a circuit design.

Figure 4A:
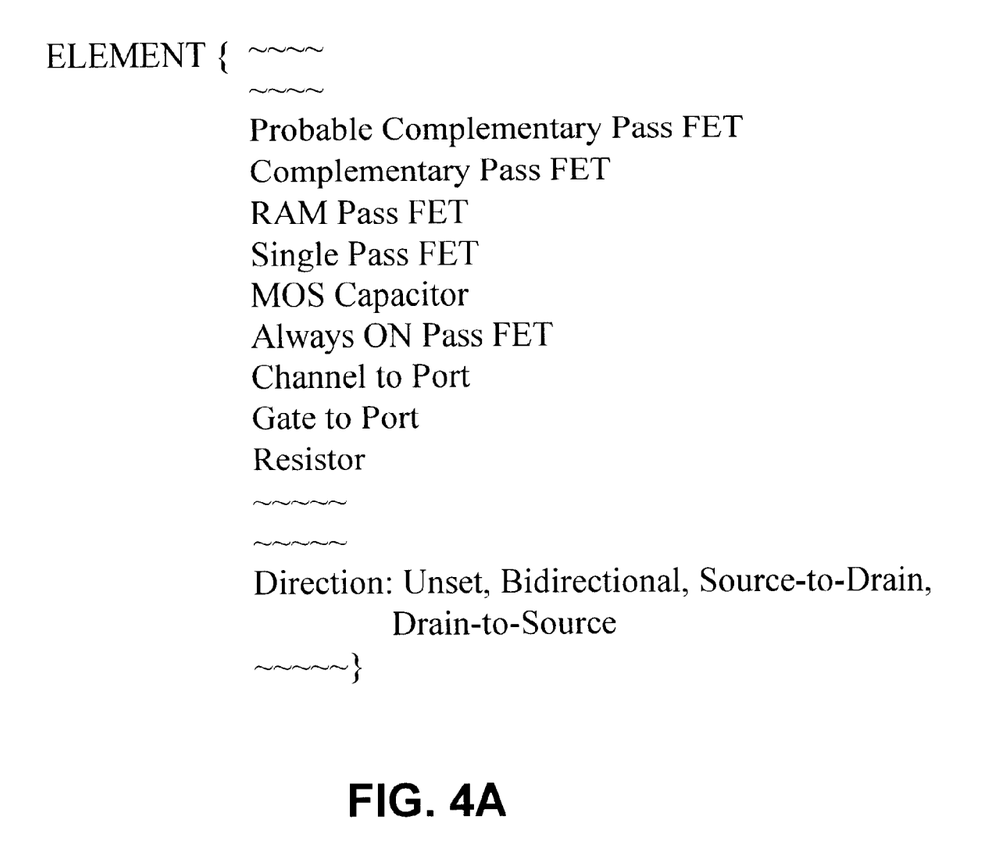
FIG. 4A is a diagram illustrating contents of a data structure containing physical characteristic values for elements of the netlist.
Figure 4B:
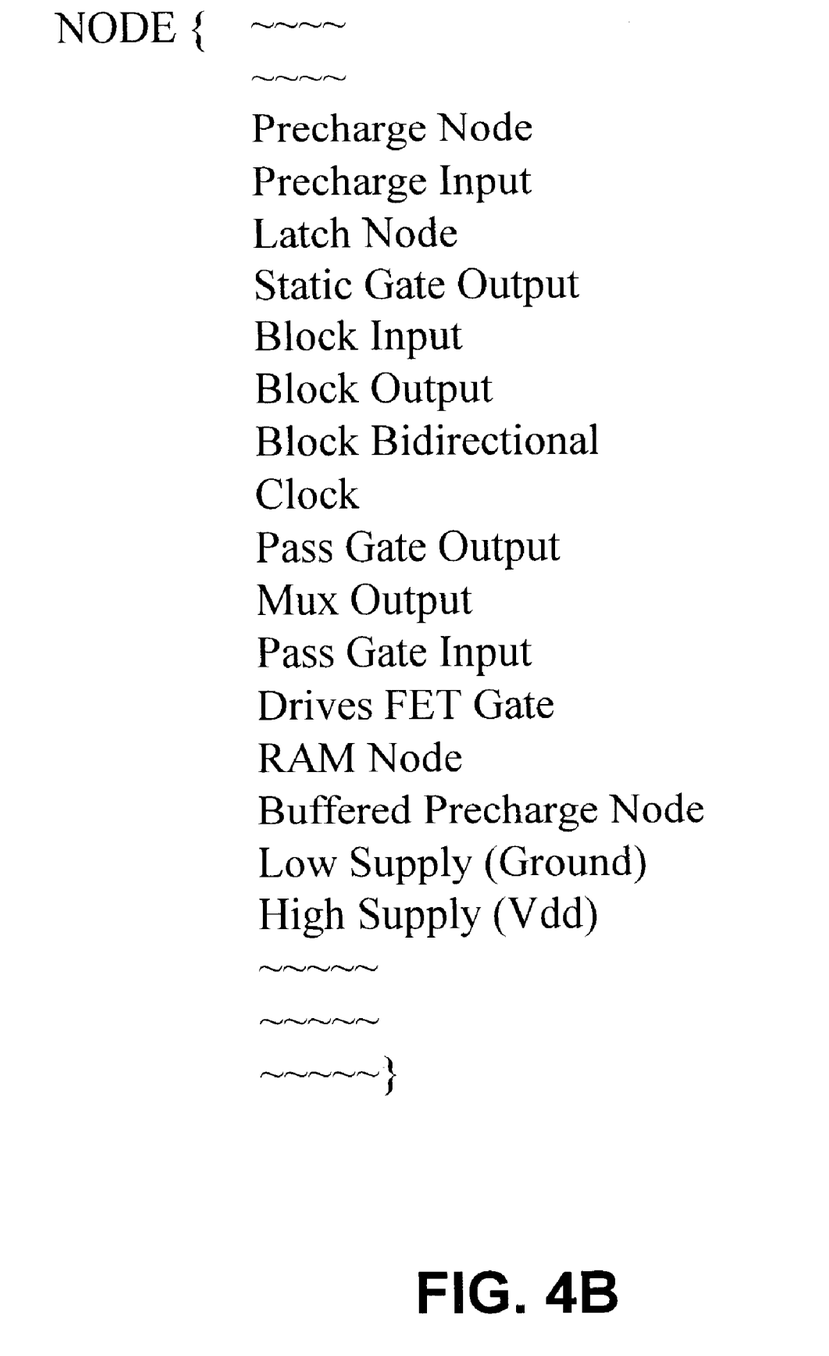
FIG. 4B is a diagram illustrating contents of a data structure containing physical characteristic values for nodes of the netlist.

Having described the generation of a database of certain frequently used physical characteristics of the present invention, reference is now made to FIGS. 4A and 4B, which illustrate element and node data structures, respectively, containing this information. It should be appreciated, however, that the broad concept of the present invention relates to the pre-computation of certain physical characteristics of a circuit, and storing those pre-computed valued in some sort of database for later retrieval. Many specific implementations may be realized to carryout this broad concept. FIGS. 4A and 4B illustrate one such implementation.

In this implementation, a data structure may be created for each element (FIG. 4A) in a netlist, and a separate data structure may be created for each circuit node (FIG. 4B) in a netlist. Each data structure preferably defines a plurality of physical characteristics that may be conveniently referenced. Generally, the various items, once calculated, will be represented by either a TRUE or FALSE value. Furthermore, each physical characteristic of the data structure will be calculated, during the front-end database generation step (step 110 of FIG. 3) for each element in the circuit defined by the netlist.

FIG. 4A illustrates several characteristics that may be calculated for each element in a circuit defined by a netlist.

These include, but are not limited to: whether the element is a probable complementary pass FET, whether the element is conclusively a complementary pass FET, whether the element is a RAM pass FET, whether the element is a single pass FET, whether the element is a MOS capacitor, whether the element is a pass FET that is always turned on, whether the element is channel-connected to a port, whether the element is gate-connected to a port, and whether the element is a resistor (or models a resistor). In addition to the characteristics listed above, which may all resolve to either a TRUE or FALSE value, other characteristics may be included, which resolve to some other value. For example, a Direction characteristic may be included, and the Direction characteristic may resolve to one of four possible values: Unset, Bidirectional, Source-to-Drain, and Drain-to-Source. Such direction information may be computed by evaluating the circuit, or alternatively, may be provided by PathMill or an equivalent, external software package. Of course, different and/or additional element characteristics may be provided, consistent with the inventive concepts.

No further discussion of these characteristics is provided, as a detailed description of the significance and/or determination of each of the foregoing characteristics need not be provided herein for an understanding and appreciation of the broader aspects of the present invention, or the implementation thereof.

FIG. 4B illustrates several characteristics that may be calculated for each node in a circuit defined by a netlist. These include, but are not limited to: whether the node is a precharge node, whether the node is an input node, whether the node is a latch node, whether the node is a static gate output node, whether the node is a block input node, whether the node is a block output node, whether the node is a bidirectional node, whether the node is a clock node, whether the node is a pass gate output node, whether the node is a multiplexer output node, whether the node is a pass gate input node, whether the node drives a FET gate, whether the node is a RAM node, whether the node is a ground node, and whether the node is a supply node. Of course, different and/or additional node characteristics may be provided, consistent with the inventive concepts.

No further discussion of these characteristics is provided, as a detailed description of the significance and/or determination of each of the foregoing characteristics need not be provided herein for an understanding and appreciation of the broader aspects of the present invention, or the implementation thereof.

Once the respective routines have been executed to compute the values for each of these items, the resultant values (for any given node or element) may be retrieved directly from the database, without having to recompute the value. For characteristics that are referenced often, this results in tremendous efficiency gains in the overall execution of the electrical rules checker 100 of the present invention. In this regard, the value of any characteristic for a given node or element may be readily retrieved by referencing the appropriate item within the data structure.

Figure 5A:
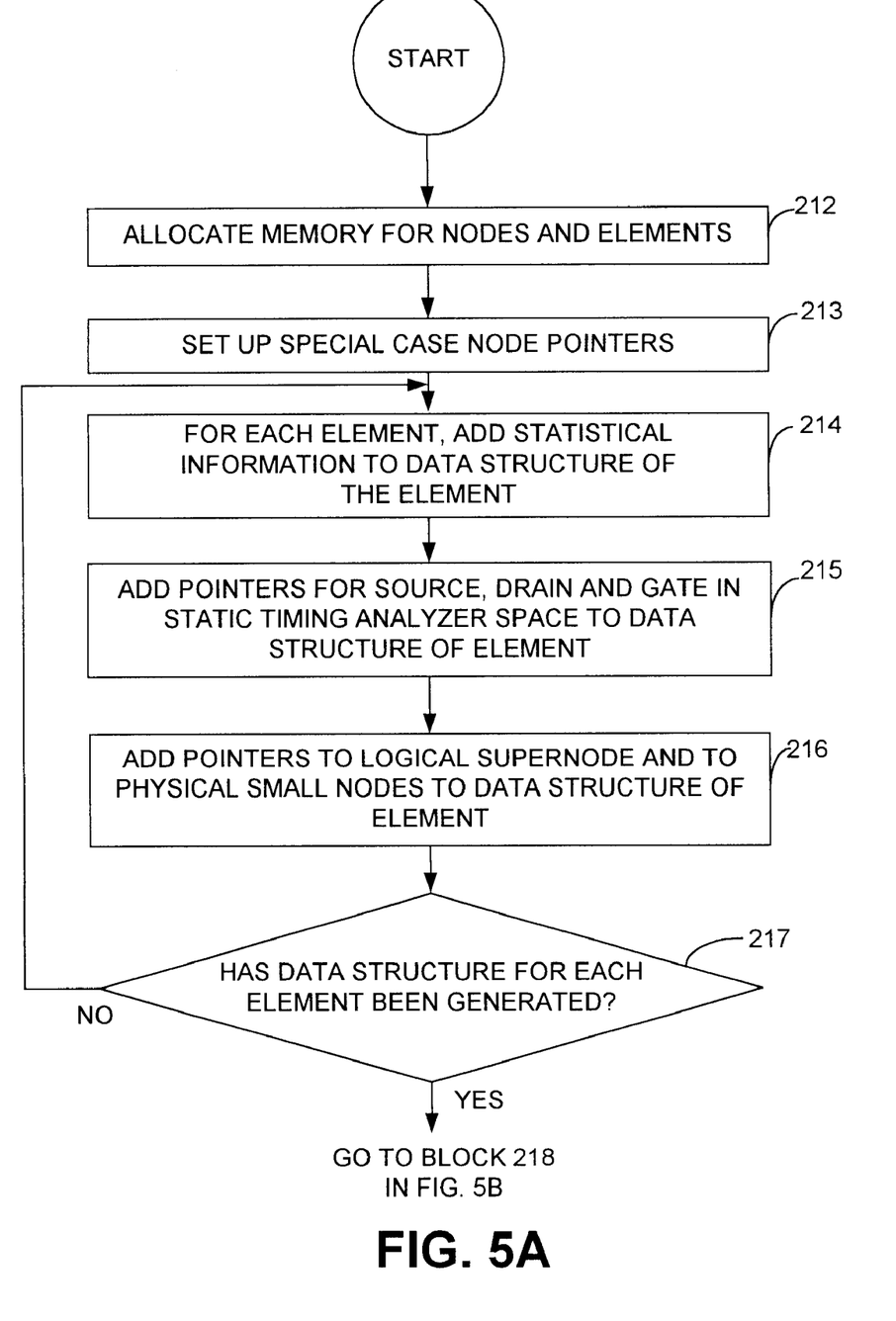
FIGS. 5A–5C together form a flow chart which illustrates the method of the present invention for generating the database of the present invention which can be utilized by a rules checking program to perform rules checking tasks.
Figure 5B:
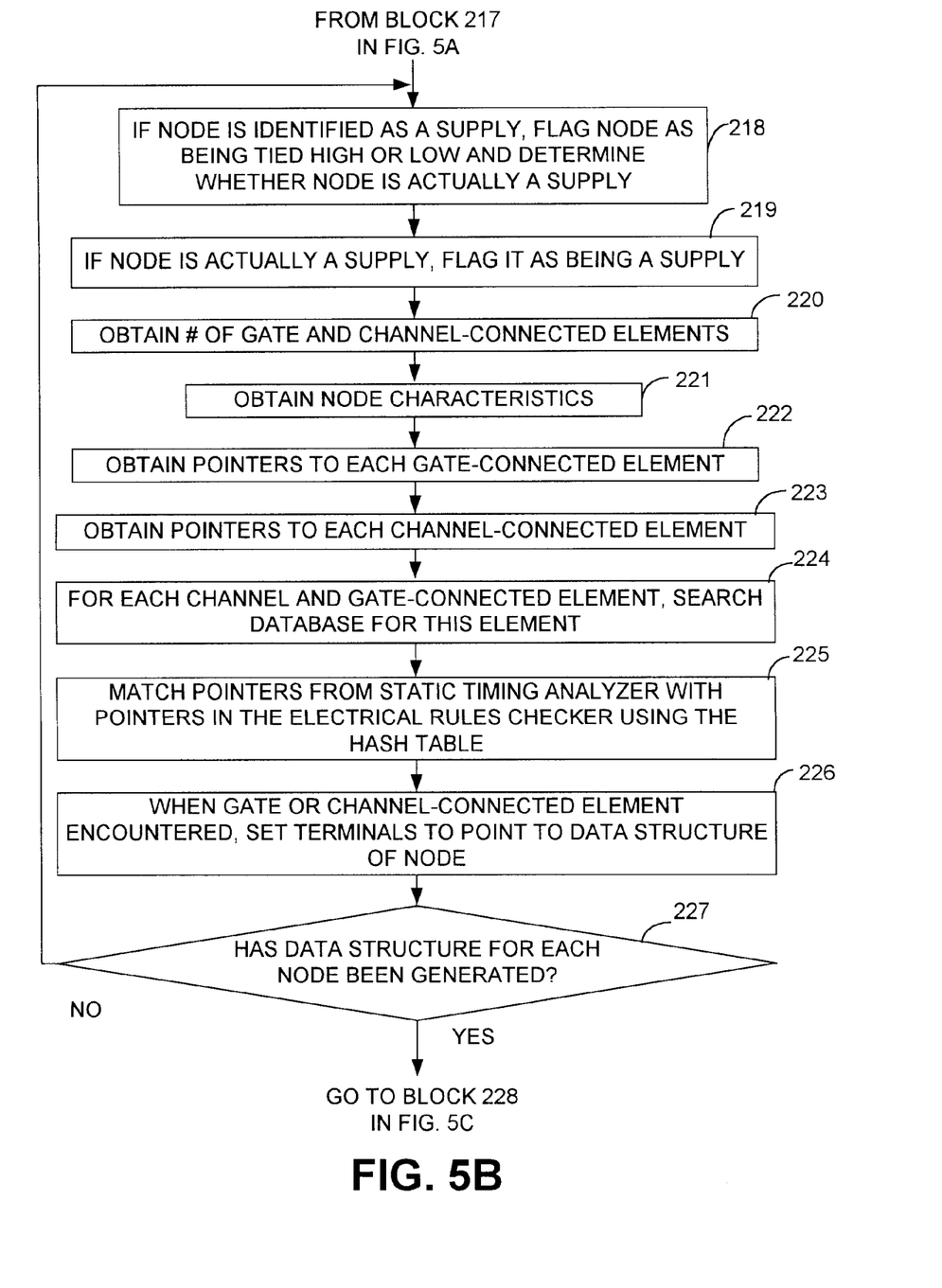
Figure 5C:
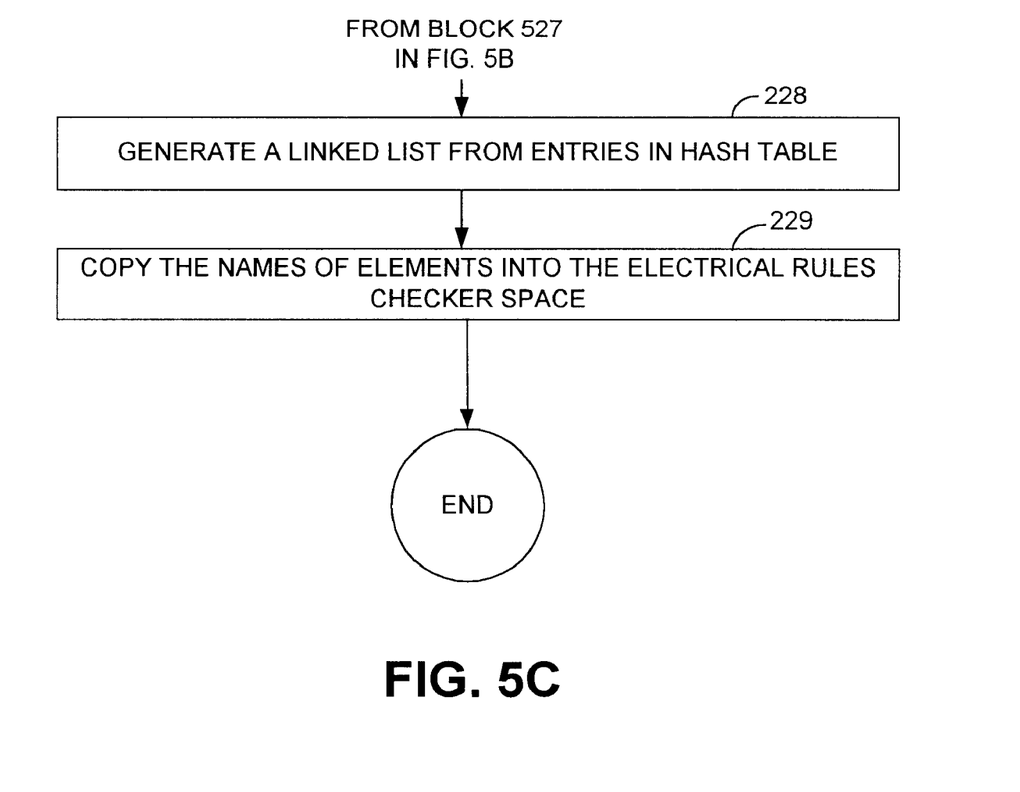

Having described the inventive aspects above, reference is now made to FIGS. 5A–5C, which collectively comprise a flowchart illustrating the manner in which this database is generated. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate the database of the present invention, as indicated by block 102.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

The first step in the process of generating the database is to allocate memory for the nodes and elements of the circuit, as indicated by block 210 in FIG. 5A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 211. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 213–216 in FIG. 5A correspond to the steps for creating the element data structures. The first element for which a data structure must be generated is obtained during the step represented by block 212. The data structure for that element is then generated and the location of the data structure is recorded in a hash table, as indicated by block 213. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 214. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 215. The pointers that were set up in step 211 are utilized in step 215. If either the source, drain or gate of the element is attached to ground or VDD, then the pointers for the source, drain and gate are set to the pointers for ground or VDD obtained in step 213.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 216, the pointers corresponding to these small nodes are added to the data structure of the element. A determination is then made at block 217 as to whether or not data structures for all of the elements have been generated. If not, the next element in the netlist is obtained, as indicated by block 218, and the process returns to block 213. If so, the process proceeds to block 219 in FIG. 5B.

Once the data structures for the elements have been generated, the data structures for the nodes must be generated. Blocks 220–227 in FIG. 5B correspond to the steps in the process of the present invention for generating the data structures of the nodes. The first node for which the data structure is to be generated is obtained at the step represented by block 219. The data structure for the node is then generated and the location is the data structure is recorded in the hash table, as indicated by block 220.

For the purpose of design quality analysis, it is important to distinguish actual supply nodes, such as VDD and GND, from other circuit nodes which have been declared to be tied high or low for the purpose of timing or other analysis. In block 221, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 221. In the step represented by block 222, the nodes which are actually supplies are flagged as supplies in the database.

The electrical rules checker 100 then obtains the number of gate-connected elements and the number of channel-connected elements from the static timing analyzer, as indicated by block 223. The electrical rules checker 100 also obtains the characteristics of the nodes from the static timing analyzer 10, as indicated by block 224. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 225. The electrical rules checker 100 then obtains the pointers from the static timing analyzer which point to each channel-connected element, as indicated by block 226.

The element pointers that are stored in the node during the steps represented by blocks 223 and 224 are pointers into the space of the static timing analyzer. Similarly, the node pointers that are stored in the element during the step represented by block 215 are pointers into the space of the static timing analyzer, except that the pointers to the VDD and GND nodes are stored as pointers to the VDD and GND nodes in the space of the electrical rules checker 100. In the step represented by block 225, some of these pointers are converted to point to the elements and nodes in the space of the electrical rules checker 100. For each of the gate-connected and channel-connected elements of the current node, the following steps are performed, which are represented by block 227:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 228 as to whether or not data structures for all of the nodes have been generated. If not, the next node in the netlist is obtained, as indicated by block 229, and the process returns to block 220.

In order to enable the electrical rules checker 100 to maximize efficiency in searching the database of the present invention, once the data structures for all of the nodes have been created, a linked list is generated from the entries in the hash table, as indicated by block 230 in FIG. 5C. Not every location in the hash table will contain a valid entry. Therefore, in order to maximize efficiency in searching the database, a linked list is generated which links the valid entries in the hash table together such that each valid entry in the hash table points to the next valid entry in the hash table. Thus, when the electrical rules checker 100 of the present invention is searching for an element in the database of the present invention, the electrical rules checker 100 simply analyzes the elements contained in the linked list.

It should be noted that the arrangement of the elements in the linked list may or may not have any physical relationship to the arrangement of the elements in the circuit under consideration. Thus, the linked list is merely used to search through the elements stored in the database. Once the linked list has been generated, the names of the elements contained in the linked list are copied into electrical rules checker space, as indicated by block 231. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. The manner in which the specific rules checking tasks are performed is not the subject of the present application and, therefore, in the interest of brevity, a discussion of the manner in which these tasks are performed will not be provided herein.

It should also be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. A method for examining a netlist to evaluate a design quality of a circuit comprising the steps of:
    (a) creating an element data structure for each circuit element in the netlist, wherein the data structure of a given element defines a plurality of physical characteristics for the element;
    (b) creating a node data structure for each circuit node in the netlist, wherein the data structure of a given node defines a plurality of physical characteristics for the node;
    (c) determining a TRUE/FALSE value for the physical characteristics for entries within both the element data structure and the node data structure; and
    (d) recording the determined TRUE/FALSE values for later retrieval.

2. The method as defined in claim 1, wherein the step of determining a TRUE/FALSE value further includes performing an independent evaluation for each entry within both data structures.

3. The method as defined in claim 1, further including the step of evaluating at least one quality aspect, wherein the quality aspect is defined by at least one of the physical characteristics.

4. The method as defined in claim 3, wherein the step of evaluating the at least one quality aspect further includes identifying the physical characteristics that define the quality aspect and retrieving from the data structures the TRUE/FALSE value of those physical characteristics that have been recorded, and independently determining a TRUE/FALSE value of those characteristics that have not been recorded in the data structures.

5. The method as defined in claim 1, wherein the physical characteristics include at least two physical characteristics selected from the group consisting of: whether a node is a precharge node, whether a node is an input node, whether a node is a latch node, whether a node is a static gate output node, whether a node is a block input node, whether a node is a block output node, whether a node is a bidirectional node, whether a node is a clock node, whether a node is a pass gate output node, whether a node is a multiplexer output node, whether a node is a pass gate input node, whether a node drives a FET gate, whether a node is a RAM node, whether a node is a ground node, whether a node is a supply node, whether an element is a probable complementary pass FET, whether an element is a pass FET, whether an element is a MOS capacitor, whether an element is a single pass FET, whether an element is a pass FET that is always on, whether an element is channel connected to a port, whether an element is gate connected to a port, and whether an element is a resistor.

6. A method for examining a netlist to evaluate a design quality of a circuit comprising the steps of:
    identifying a plurality of quality aspects to be evaluated, wherein each quality aspect is defined by at least one of a plurality of physical characteristics;
    selecting a group of physical characteristics, from the plurality of physical characteristics to be determined in evaluating the design quality of the circuit;
    determining a TRUE/FALSE value for each physical characteristic of the group of characteristics;
    recording the determined value for later retrieval; and
    evaluating the plurality of quality aspects.

7. The method as defined in claim 6, wherein the step of evaluating the plurality of quality aspects includes the step of ascertaining a TRUE/FALSE value for the plurality of physical characteristics.

8. The method as defined in claim 7, wherein the step of ascertaining a TRUE/FALSE value for a plurality of the physical characteristics includes retrieving the stored value for those physical characteristics within the group of physical characteristics.

9. The method as defined in claim 7, wherein the step of ascertaining a TRUE/FALSE value for a plurality of the physical characteristics includes determining, independently the TRUE/FALSE value for those physical characteristics not within the group of physical characteristics.

10. The method as defined in claim 6, wherein the step of recording the determined value includes storing the determined value within a data structure of physical characteristics.

11. The method as defined in claim 10, wherein the step of storing the determined value within a data structure further includes the step of storing the determined value within one of two data structures, wherein a first data structure stores physical characteristics associated with nodes of the circuit, and a second data structure stores physical characteristics associated with elements of the circuit.

12. A system for examining a netlist to evaluate a design quality of a circuit comprising:
    an element data structure for defining each circuit element in the netlist, wherein the data structure of a given element defines a plurality of characteristics for the element;
    means for generating TRUE/FALSE value for the characteristics for entries within the element data structure; and means for recording the determined TRUE/FALSE values for later retrieval.

13. The system as defined in claim 12, further including a node data structure for defining each circuit node in the netlist, wherein the data structure of a given node defines a plurality of characteristics for the node.

14. The system as defined in claim 13, wherein the means for generating a TRUE/FALSE value further includes means for performing an independent evaluation for each entry within both data structures.

15. The system as defined in claim 13, further including means for evaluating at least one quality aspect, wherein the quality aspect is defined by at least one of the characteristics.

16. The system as defined in claim 15, wherein the means for evaluating the at least one quality aspect further includes means for identifying the characteristics that define the quality aspect and retrieving from the data structures the TRUE/FALSE value of those characteristics that have been recorded, and independently determining a TRUE/FALSE value of those characteristics that have not been recorded in the data structures.

17. The system as defined in claim 13, wherein the characteristics defined within the node data structure include at least one characteristic from the group consisting of: whether a node is a precharge node, whether a node is an input node, whether a node is a latch node, whether a node is a static gate output node, whether a node is a block input node, whether a node is a block output node, whether a node is a bidirectional node, whether a node is a clock node, whether a node is a pass gate output node, whether a node is a multiplexer output node, whether a node is a pass gate input node, whether a node drives a FET gate, whether a node is a RAM node, whether a node is a ground node, and whether a node is a supply node.

18. The system as defined in claim 12, wherein the characteristics defined within the element data structure include at least one characteristic selected from the group consisting of: whether an element is probable complementary pass FET, whether an element is a pass FET, whether an element is a MOS capacitor, whether an element is a single pass FET, whether an element is a pass FET that is always on, whether an element is channel connected to a port, whether an element is gate connected to a port, and whether an element is a resistor.

* * * * *